United States Patent
Kim et al.

(10) Patent No.: US 9,842,882 B1
(45) Date of Patent: Dec. 12, 2017

(54) ELECTRONIC DEVICE

(71) Applicant: SK hynix Inc., Icheon (KR)

(72) Inventors: Myoung-Sub Kim, Seongnam (KR); Hyun-Jeong Kim, Yongin (KR); Woo-Tae Lee, Seoul (KR)

(73) Assignee: SK HYNIX INC., Icheon (KR)

( * ) Notice: Subject to any disclaimer, the term of this patent is extended or adjusted under 35 U.S.C. 154(b) by 0 days.

(21) Appl. No.: 15/451,215

(22) Filed: Mar. 6, 2017

Related U.S. Application Data

(60) Provisional application No. 62/338,257, filed on May 18, 2016.

(51) Int. Cl.
| | |
|---|---|
| *H01L 27/24* | (2006.01) |
| *H01L 23/528* | (2006.01) |
| *H01L 45/00* | (2006.01) |
| *G11C 13/00* | (2006.01) |

(52) U.S. Cl.
CPC ........ *H01L 27/2463* (2013.01); *G11C 13/004* (2013.01); *G11C 13/0069* (2013.01); *H01L 23/528* (2013.01); *H01L 27/2409* (2013.01); *H01L 45/126* (2013.01); *H01L 45/1233* (2013.01); *G11C 2013/0045* (2013.01); *G11C 2013/0078* (2013.01)

(58) Field of Classification Search
CPC ............. H01L 27/2463; H01L 45/1233; H01L 27/2409; H01L 45/126; H01L 23/528; G11C 13/0069; G11C 13/004; G11C 2013/0078; G11C 2013/0045
See application file for complete search history.

(56) References Cited

U.S. PATENT DOCUMENTS

| | | | |
|---|---|---|---|
| 7,538,338 B2 * | 5/2009 | Rinerson | G11C 11/5685 257/2 |
| 8,871,564 B2 | 10/2014 | Wang et al. | |

* cited by examiner

*Primary Examiner* — David Vu

(57) ABSTRACT

A semiconductor memory includes first to third lines, the second line crossing the first and third lines between the first line and the third line, a first memory element overlapping an intersection region of the first and second lines between the first line and the second line, the first memory element including a first memory layer, a first electrode under the first memory layer, and a second electrode over the first memory layer, and a second memory element overlapping an intersection region of the second and third lines between the second line and the third line, the second memory element including a second memory layer, a third electrode under the second memory layer, and a fourth electrode over the second memory layer. An electrical resistance relation of the third and fourth electrodes is controlled according to an electrical resistance relation of electrical resistances of the first and second electrodes.

19 Claims, 10 Drawing Sheets

ELECTRONIC DEVICE

CROSS-REFERENCE TO RELATED APPLICATIONS

The present application claims priority to U.S. Provisional Patent Application No. 62/338,257, filed on May 18, 2016, which is incorporated herein by reference in its entirety.

TECHNICAL FIELD

This patent document relates to memory circuits or devices and their applications in electronic devices or systems.

BACKGROUND

Recently, as electronic appliances trend toward miniaturization, low power consumption, high performance, multi-functionality, and so on, semiconductor devices capable of storing information in various electronic appliances such as a computer, a portable communication device, and so on have been demanded in the art, and research has been conducted for the semiconductor devices. Such semiconductor devices include semiconductor devices which can store data using a characteristic that they are switched between different resistant states according to an applied voltage or current, for example, an RRAM (resistive random access memory), a PRAM (phase change random access memory), an FRAM (ferroelectric random access memory), an MRAM (magnetic random access memory), an E-fuse, etc.

SUMMARY

The disclosed technology in this patent document includes various implementations of an electronic device which has improved operation characteristics.

In an implementation, an electronic device includes a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode.

Implementations of the above electronic device may include one or more the following.

The first electrode and the fourth electrode include the same first material, and the second electrode and the third electrode include the same second material. When a voltage applied to the second line is relatively positive compared to voltages applied to the first and third lines, the first electrode includes a material having a smaller resistance value than a material of the second electrode, and the third electrode includes a material having a larger resistance value than a material of the fourth electrode. When a voltage applied to the second line is relatively negative compared to voltages applied to the first and third lines, the first electrode includes a material having a larger resistance value than a material of the second electrode, and the third electrode includes a material having a smaller resistance value than a material of the fourth electrode. A maximum temperature point of the first memory element moves toward the second electrode compared to a case in which the first electrode and the second electrode include the same first material, and wherein a maximum temperature point of the second memory element moves toward the third electrode compared to a case in which the third electrode and the fourth electrode include the same second material. A maximum temperature point of the first memory element moves toward the first electrode compared to a case in which the first electrode and the second electrode include the same first material, and wherein a maximum temperature point of the second memory element moves toward the fourth electrode compared to a case in which the third electrode and the fourth electrode include the same second material. Each of the first to fourth electrodes includes N doped carbon, carbon, high Al doped TiAlN, TiAlN, TiSiN, TaN, Ta, WN, TiN, Ti, W, Al, Cu, or a combination thereof. The first and second memory layers include a variable resistance material that switches between different resistance states according to an applied voltage or current. The semiconductor memory further comprises: a first selection element layer interposed between the first line and the first electrode or between the second line and the second electrode; and a second selection element layer interposed between the second line and the third electrode or between the third line and the fourth electrode. Each of the first and second memory elements has an island shape having four sidewalls, wherein first two opposite sidewalls of the first memory element are aligned with sidewalls of the first line, and second two opposite sidewalls of the first memory element are aligned with sidewalls of the second line, and wherein first two opposite sidewalls of the second memory element are aligned with the sidewalls of the second line, and second two opposite sidewalls of the second memory element are aligned with sidewalls of the third line.

In another implementation, an electronic device includes a semiconductor memory, which includes: a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when a thermal conductivity of the first electrode is larger than a thermal conductivity of the second electrode, a thermal conductivity of the third electrode is smaller than a thermal conductivity of the fourth electrode, and wherein when the thermal conductivity of the first electrode is smaller than the thermal conductivity of the second electrode, the thermal conductivity of the third electrode is larger than the thermal conductivity of the fourth electrode.

Implementations of the above electronic device may include one or more the following.

The first electrode and the fourth electrode include the same first material, and the second electrode and the third electrode include the same second material. When a voltage applied to the second line is relatively positive compared to voltages applied to the first and third lines, the first electrode includes a material having a larger thermal conductivity than a material of the second electrode, and the third electrode includes a material having a smaller thermal conductivity than a material of the fourth electrode. When a voltage applied to the second line is relatively negative compared to voltages applied to the first and third lines, the first electrode includes a material having a smaller thermal conductivity than a material of the second electrode, and the third electrode includes a material having a larger thermal conductivity than a material of the fourth electrode. A maximum temperature point of the first memory element moves toward the second electrode compared to a case in which the first electrode and the second electrode include the same first material, and wherein a maximum temperature point of the second memory element moves toward the third electrode compared to a case in which the third electrode and the fourth electrode include the same second material. A maximum temperature point of the first memory element moves toward the first electrode compared to a case in which the first electrode and the second electrode include the same first material, and wherein a maximum temperature point of the second memory element moves toward the fourth electrode compared to a case in which the third electrode and the fourth electrode include the same second material. Each of the first to fourth electrodes includes N doped carbon, carbon, high Al doped TiAlN, TiAlN, TiSiN, TaN, Ta, WN, TiN, Ti, W, Al, Cu, or a combination thereof. The first and second memory layers include a variable resistance material that switches between different resistance states according to an applied voltage or current. The semiconductor memory further comprises: a first selection element layer interposed between the first line and the first electrode or between the second line and the second electrode; and a second selection element layer interposed between the second line and the third electrode or between the third line and the fourth electrode. Each of the first and second memory elements has an island shape having four sidewalls, wherein first two opposite sidewalls of the first memory element are aligned with sidewalls of the first line, and second two opposite sidewalls of the first memory element are aligned with sidewalls of the second line, and wherein first two opposite sidewalls of the second memory element are aligned with the sidewalls of the second line, and second two opposite sidewalls of the second memory element are aligned with sidewalls of the third line.

In still another implementation, an electronic device includes a semiconductor memory, which includes: a first line extending in a first direction; a second line extending in a second direction crossing the first direction; a third line extending in a third direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein a voltage having a first polarity is applied to the second line and voltages having a second polarity opposite to the first polarity are applied to the first and second lines, and wherein the first electrode includes a material having a different electrical resistance value from a material of the second electrode and the third electrode includes a material having a different electrical resistance value from a material of the fourth electrode, a maximum temperature point of the first memory element being positioned similarly to a maximum temperature point of the second memory element when the voltages are applied to the first to third lines.

The electronic device may further include a microprocessor which includes: a control unit configured to receive a signal including a command from an outside of the microprocessor, and performs extracting, decoding of the command, or controlling input or output of a signal of the microprocessor; an operation unit configured to perform an operation based on a result that the control unit decodes the command; and a memory unit configured to store data for performing the operation, data corresponding to a result of performing the operation, or an address of data for which the operation is performed, wherein the semiconductor memory is part of the memory unit in the microprocessor.

The electronic device may further include a processor which includes: a core unit configured to perform, based on a command inputted from an outside of the processor, an operation corresponding to the command, by using data; a cache memory unit configured to store data for performing the operation, data corresponding to a result of performing the operation, or an address of data for which the operation is performed; and a bus interface connected between the core unit and the cache memory unit, and configured to transmit data between the core unit and the cache memory unit, wherein the semiconductor memory is part of the cache memory unit in the processor.

The electronic device may further include a processing system which includes: a processor configured to decode a command received by the processor and control an operation for information based on a result of decoding the command; an auxiliary memory device configured to store a program for decoding the command and the information; a main memory device configured to call and store the program and the information from the auxiliary memory device such that the processor can perform the operation using the program and the information when executing the program; and an interface device configured to perform communication between at least one of the processor, the auxiliary memory device and the main memory device and the outside, wherein the semiconductor memory is part of the auxiliary memory device or the main memory device in the processing system.

The electronic device may further include a data storage system which includes: a storage device configured to store data and conserve stored data regardless of power supply; a controller configured to control input and output of data to and from the storage device according to a command inputted from an outside; a temporary storage device configured to temporarily store data exchanged between the storage device and the outside; and an interface configured to perform communication between at least one of the storage device, the controller and the temporary storage device and the outside, wherein the semiconductor memory is part of the storage device or the temporary storage device in the data storage system.

The electronic device may further include a memory system which includes: a memory configured to store data and conserve stored data regardless of power supply; a memory controller configured to control input and output of data to and from the memory according to a command inputted from an outside; a buffer memory configured to buffer data exchanged between the memory and the outside; and an interface configured to perform communication between at least one of the memory, the memory controller and the buffer memory and the outside, wherein the semiconductor memory is part of the memory or the buffer memory in the memory system.

These and other aspects, implementations and associated advantages are described in greater detail in the drawings, the description and the claims.

DETAILED DESCRIPTION

Figure 1A:
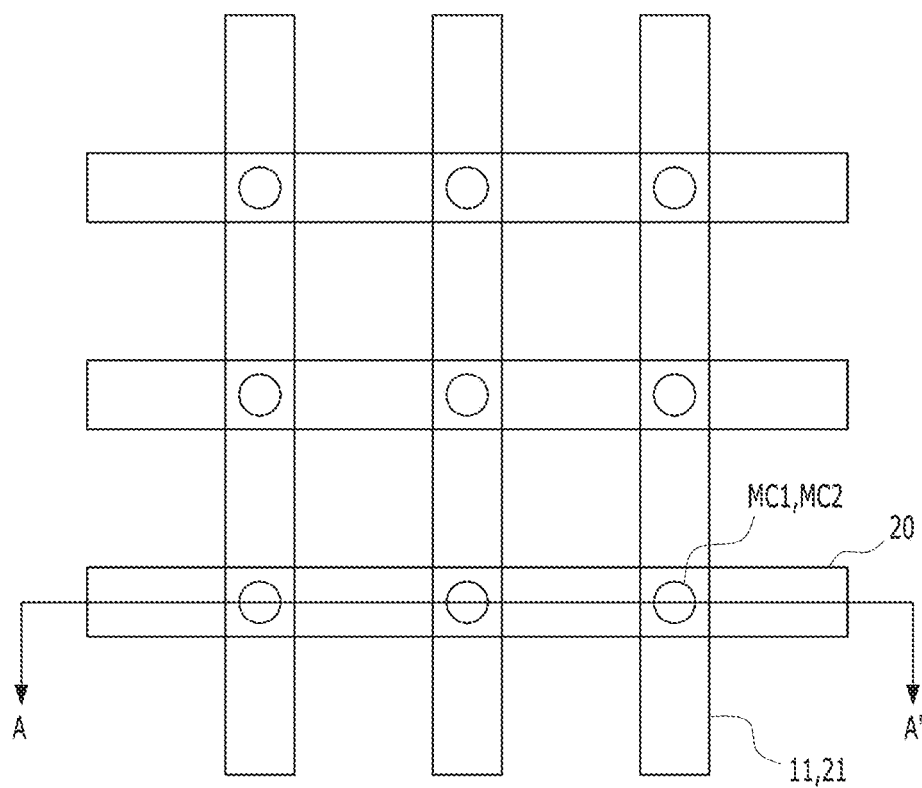
FIGS. 1A and 1B are views illustrating a semiconductor memory according to a comparative example.

Various examples and implementations of the disclosed technology are described below in detail with reference to the accompanying drawings.

The drawings may not be necessarily to scale and in some instances, proportions of at least some of structures in the drawings may have been exaggerated in order to clearly illustrate certain features of the described examples or implementations. In presenting a specific example in a drawing or description having two or more layers in a multi-layer structure, the relative positioning relationship of such layers or the sequence of arranging the layers as shown reflects a particular implementation for the described or illustrated example and a different relative positioning relationship or sequence of arranging the layers may be possible. In addition, a described or illustrated example of a multi-layer structure may not reflect all layers present in that particular multilayer structure (e.g., one or more additional layers may be present between two illustrated layers). As a specific example, when a first layer in a described or illustrated multi-layer structure is referred to as being "on" or "over" a second layer or "on" or "over" a substrate, the first layer may be directly formed on the second layer or the substrate but may also represent a structure where one or more other intermediate layers may exist between the first layer and the second layer or the substrate.

Prior to describing implementations of the present disclosure, a semiconductor memory according to a comparative example and issues thereof will be described.

Figure 1B:
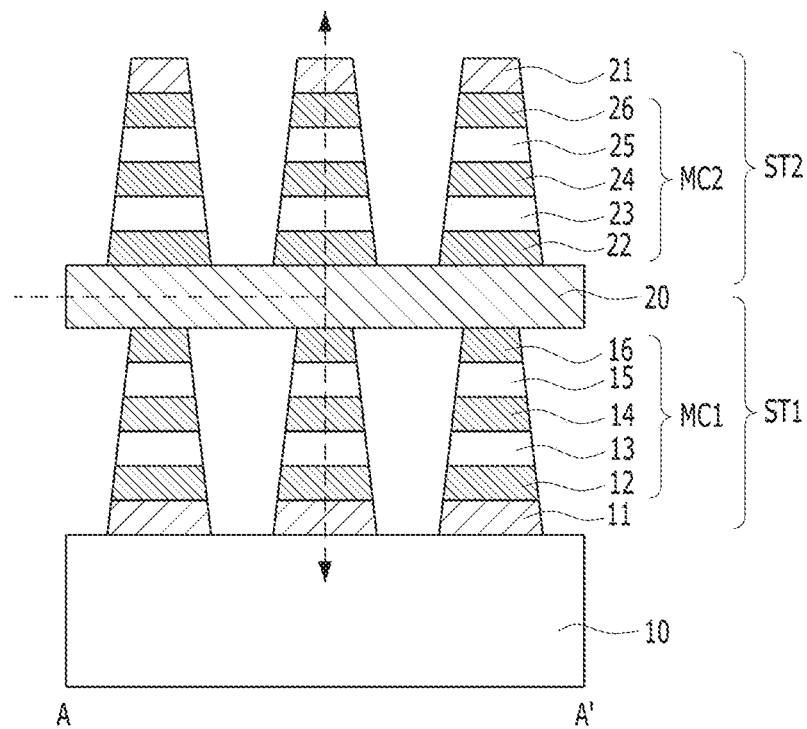

FIGS. 1A and 1B are views illustrating a semiconductor memory according to a comparative example. FIG. 1A shows a plan view, and FIG. 1B shows a cross-sectional view taken along a line A-A' of FIG. 1A.

Referring to FIGS. 1A and 1B, the semiconductor memory according to the comparative example may include a substrate 10, first lines 11 formed over the substrate 10 and extending in a first direction crossing the line A-A', second lines 20 formed over the first lines 11 and extending in a second direction parallel to the line A-A', third lines 21 formed over the second lines 20 and extending in the first direction to overlap the first lines 11 when viewed in a plan view, first memory cells MC1 disposed between the first lines 11 and the second lines 20, and second memory cells MC2 disposed between the second lines 20 and the third lines 21. The second lines 20 are spaced apart from the first lines 11, and the third lines 21 are spaced apart from the second lines 20. The first memory cells MC1 are disposed in intersection regions between the first lines 11 and the second lines 20, and extend in a third direction perpendicular to the first and second directions. The second memory cells MC2 are disposed in intersection regions between the second lines 20 and the third lines 21, and extend in the third direction.

The first memory cell MC1 may include a first lower electrode layer 12, a first selection element layer 13, a first middle electrode layer 14, a first memory layer 15, and a first upper electrode layer 16, which are sequentially stacked over the first line 11. The first lower electrode layer 12 may be located at a lowermost portion of the first memory cell MC1 and may function as a transfer path of a voltage or current supplied from the first line 11. The first selection element layer 13 may control access to the first memory layer 15. The first middle electrode layer 14 may physically separate the first selection element layer 13 and the first memory layer 15 from each other while electrically coupling the first selection element layer 13 and the first memory layer 15 with each other. The first memory layer 15 may store different data according to different resistance states of the first memory layer 15. The first upper electrode layer 16 may be located at an uppermost portion of the first memory cell MC1 and may function as a transfer path of a voltage or current supplied from the second line 20.

Similarly, the second memory cell MC2 may include a second lower electrode layer 22, a second selection element layer 23, a second middle electrode layer 24, a second memory layer 25, and a second upper electrode layer 26, which are sequentially stacked over the second line 20. The second lower electrode layer 22 may be located at a lowermost portion of the second memory cell MC2 and may function as a transfer path of a voltage or current supplied from the second line 20. The second selection element layer 23 may control access to the second memory layer 25. The second middle electrode layer 24 may physically separate the second selection element layer 23 and the second memory layer 25 from each other while electrically coupling the second selection element layer 23 and the second memory layer 25 with each other. The second memory layer 25 may store different data according to different resistance states of the second memory layer 25. The second upper electrode layer 26 may be located at an uppermost portion of the second memory cell MC2 and may function as a transfer path of a voltage or current supplied from the third line 21.

The first lower electrode layer 12, the first selection element layer 13, the first middle electrode layer 14, the first memory layer 15, and the first upper electrode layer 16 may be formed of substantially the same materials and have substantially the same shapes as the second lower electrode layer 22, the second selection element layer 23, the second middle electrode layer 24, the second memory layer 25, and the second upper electrode layer 26, respectively. That is, the first memory cell MC1 and the second memory cell MC2 may have substantially the same structure.

The first lines 11, the second lines 20, and the first memory cells MC1 may be referred to as a first stack structure ST1. The second lines 20, the third lines 21, and the second memory cells MC2 may be referred to as a second stack structure ST2. The first stack structure ST1 and the second stack structure ST2 may share the second lines 20. Therefore, when the first lines 11 and the third lines 21 function as word lines, the second lines 20 may function as common bit lines. Alternatively, when the first lines 11 and the third lines 21 function as bit lines, the second lines 20 may function as common word lines.

However, although the first memory cell MC1 and the second memory cell MC2 have substantially the same structure, the first memory cell MC1 may operate differently from the second memory cell MC2 during a write operation and/or a read operation. Because the first stack structure ST1 and the second stack structure ST2 share the second lines 20, a polarity of a voltage applied to the first memory cell MC1 and/or a direction of a current flowing through the first memory cell MC1 are therefore opposite to a polarity of a voltage applied to the second memory cell MC2 and/or a direction of a current flowing through the second memory cell MC2.

For example, when a certain positive voltage is applied to the second line 20 and a certain negative voltage is applied to the first and third lines 11 and 21 during a certain operation, as shown by dotted arrows in FIG. 1B, a direction of a current flowing through the first memory cell MC1 may be opposite to a direction of a current flowing through the second memory cell MC2. In this case, a magnitude of the current flowing through the first memory cell MC1 may be different from a magnitude of the current flowing through the second memory cell MC2 during the read operation and/or the write operation due to an influence of a thermo-electric effect in which a thermal flux is generated differently depending on a direction of a current flux. This is well illustrated in FIG. 2, which will be described below.

Figure 2:
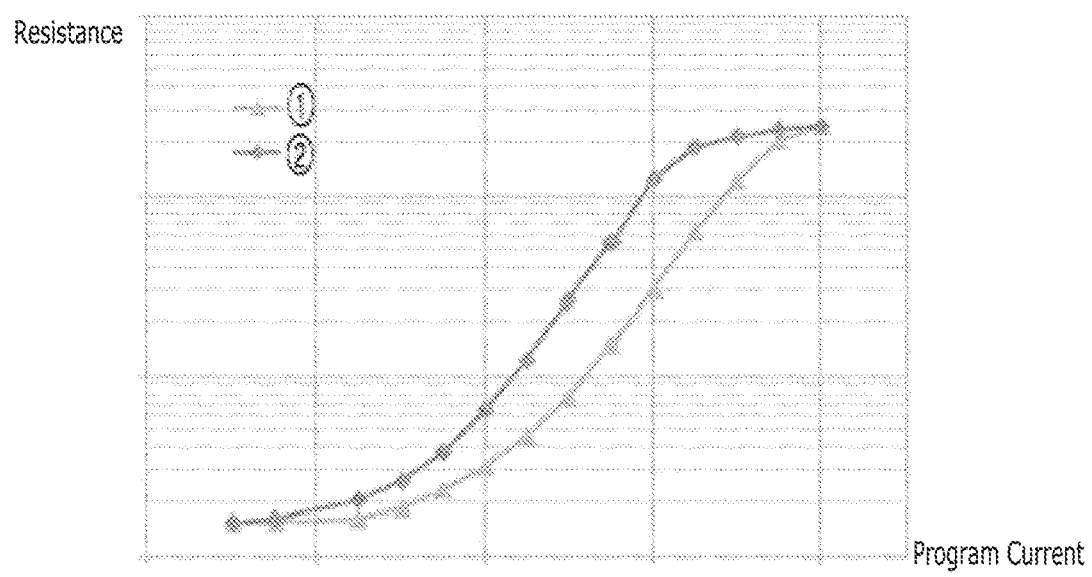
FIG. 2 is a graph illustrating current flows during operations of a first memory cell and a second memory cell in the semiconductor memory of FIGS. 1A and 1B.

FIG. 2 is a graph illustrating current flows during operations of the first memory cell MC1 and the second memory cell MC2 in the semiconductor memory of FIGS. 1A and 1B.

Referring to FIG. 2, when a positive voltage having a certain magnitude is applied to the second line 20 and a negative voltage having a certain magnitude is applied to the first and third lines 11 and 21, a current flowing through the first memory cell MC1 (see ①) is substantially different from a current flowing through the second memory cell MC2 (see ②). In other words, the first and second memory cells MC1 and MC2 have different resistance values even if currents having the same magnitude flow through the first and second memory cells MC1 and MC2.

As a result, operating characteristics of the first memory cell MC1 and the second memory cell MC2 may be different from each other.

In implementations of the present disclosure, a semiconductor memory having a lower stack structure and an upper stack structure that can operate symmetrically will be provided by solving the aforementioned issue shown in FIG. 2.

Figure 3A:
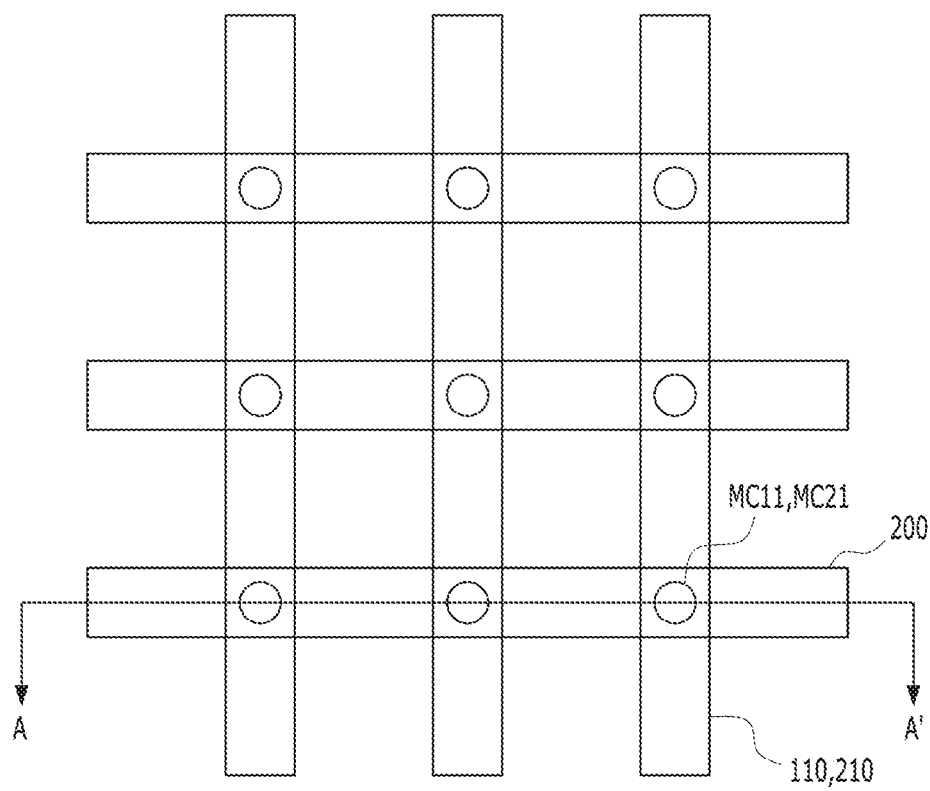
FIGS. 3A and 3B are views illustrating a semiconductor memory according to an implementation of the present disclosure.
Figure 3B:
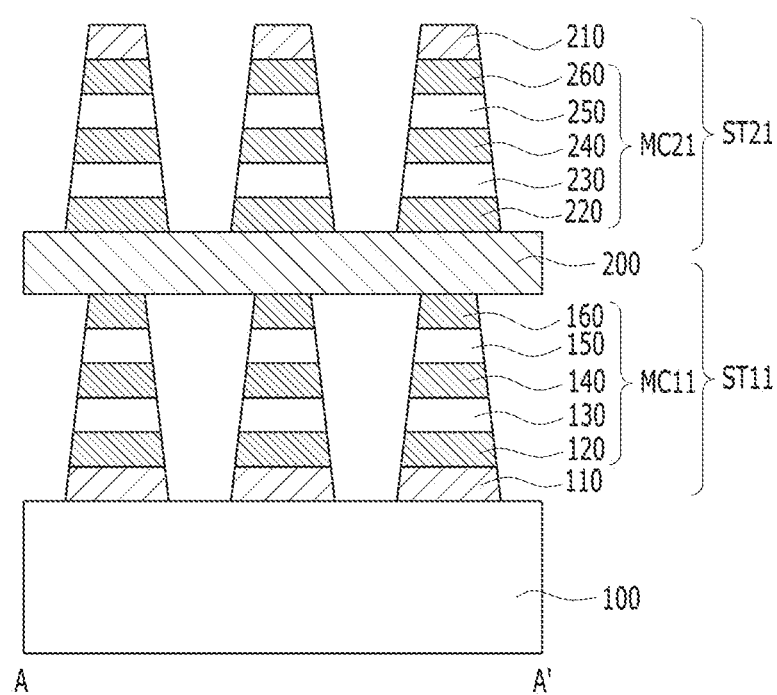

FIGS. 3A and 3B are views illustrating a semiconductor memory according to an implementation of the present disclosure. FIG. 3A shows a plan view, and FIG. 3B shows a cross-sectional view taken along a line A-A' of FIG. 3A.

Referring to FIGS. 3A and 3B, the semiconductor memory according to the implementation may include a substrate 100, first lines 110 disposed over the substrate 100, second lines 200 disposed over the first lines 110, third lines 210 disposed over the second lines 200, first memory cells MC11 disposed in intersection regions between the first lines 110 and the second lines 200, and second memory cells MC21 disposed in intersection regions between the second lines 200 and the third lines 210. The first lines 110 extend in a first direction crossing the line A-A'. The second lines 200 are spaced apart from the first lines 110 and extend in a second direction parallel to the line A-A'. The third lines 210 are spaced apart from the second lines 200, and extend in the first direction. The third lines 210 may vertically overlap the first lines 110. The first memory cells MC11 extend between the first lines 110 and the second lines 200 in a third direction perpendicular to the first and second directions. The second memory cells MC21 extend between the second lines 200 and the third lines 210 in the third direction.

The first lines 110, the second lines 200, and the first memory cells MC11 may be referred to as a first stack structure ST11. The second lines 200, the third lines 210, and the second memory cells MC21 may be referred to as a second stack structure ST21. The first stack structure ST11 and the second stack structure ST21 may share the second lines 200. Therefore, when the first lines 110 and the third lines 210 function as word lines, the second lines 200 may function as common bit lines. Alternatively, when the first lines 110 and the third lines 210 function as bit lines, the second lines 200 may function as common word lines. A space between the first lines 110, a space between the first memory cells MC11, a space between the second lines 200, a space between the second memory cells MC21, and/or a space between the third lines 210 may be filled with insulating materials (not shown).

The substrate 100 may include a lower structure (not shown). For example, the substrate 100 may include at least one transistor for controlling the first lines 110, the second lines 200, and/or the third lines 210.

The first line 110, the second line 200, and the third line 210 may have a single-layered structure or multi-layered structure including at least one of various conductive materials, such as a metal, a metal nitride, or a combination thereof. In this implementation shown in FIGS. 3A and 3B, the first lines 110 vertically overlap the third lines 210, respectively. That is, the first lines 110 may completely overlap the third lines 210 from the perspective of a plan view. However, in another implementation, the first lines 110 may not completely overlap the third lines 210. For example, the third line 210, which crosses the second lines 200, may extend in a different direction from the first line 110. In an implementation, an extending direction of the third line 210 may form an oblique angle with an extending direction of the first line 110.

The first memory cell MC11 may include a first lower electrode layer 120, a first selection element layer 130, a first middle electrode layer 140, a first memory layer 150, and a first upper electrode layer 160, which are sequentially stacked over the first line 110. However, positions of the first selection element layer 130 and the first memory layer 150 may be reversed with each other. That is, while the first memory layer 150 may be closer to the first line 110, the first selection element layer 130 may be closer to the second line 200. The first memory cell MC11 may further include one or more layers for improving characteristics of the first memory cell MC11, in addition to the layers 120 to 160.

The first lower electrode layer 120 may be located at a lowermost portion of the first memory cell MC11 and may function as a transfer path of a voltage or current supplied from the first line 110. The first selection element layer 130 may control access to the first memory layer 150. The first middle electrode layer 140 may physically separate the first selection element layer 130 and the first memory layer 150 from each other while electrically coupling the first selection element layer 130 and the first memory layer 150 with each other. The first memory layer 150 may store different data according to different resistance states of the first memory layer 150. The first upper electrode layer 160 may be located at an uppermost portion of the first memory cell MC11 and function as a transfer path of a voltage or current supplied from the second line 200.

Similarly, the second memory cell MC21 may include a second lower electrode layer 220, a second selection element layer 230, a second middle electrode layer 240, a second memory layer 250, and a second upper electrode layer 260, which are sequentially stacked over the second line 200. However, positions of the second selection element layer 230 and the second memory layer 250 may be reversed with each other as described above with respect to the first selection element layer 130 and the first memory layer 150. The second memory cell MC21 may further include one or more layers for improving characteristics of the second memory cell MC21, in addition to the layers 220 to 260.

The second lower electrode layer 220 may be located at a lowermost portion of the second memory cell MC21 and function as a transfer path of a voltage or current supplied from the second line 200. The second selection element layer 230 may control access to the second memory layer 250. The second middle electrode layer 240 may physically separate the second selection element layer 230 and the second memory layer 250 from each other while electrically coupling the second selection element layer 230 and the second memory layer 250 with each other. The second memory layer 250 may store different data according to different resistance states of the second memory layer 250. The second upper electrode layer 260 may be located at an uppermost portion of the second memory cell MC21 and function as a transfer path of a voltage or current supplied from the third line 210.

A layered structure and/or a shape of the first memory cell MC11 may be substantially the same as a layered structure and/or a shape of the second memory cell MC21, respectively. A specific layered structure may have a specific stacking order of layers.

The first and second selection element layers 130 and 230 may have a selection element characteristic in order to perform the aforementioned access function to the first and second memory layers 150 and 250, respectively. That is, the first and second selection element layers 130 and 230 may substantially block a current flow therethrough when a level of a voltage or current applied thereto is equal to or lower than a certain threshold value, and may allow a current flow therethrough, the flowing current sharply increasing in substantial proportion to a magnitude of the applied voltage or current when the level of the applied voltage or current is higher than the certain threshold value.

Each of the first and second selection element layers 130 and 230 may use a Metal-Insulator-Transition (MIT) device including $NbO_2$ or $TiO_2$, a Mixed Ion-Electron Conducting (MIEC) device including $ZrO_2(Y_2O_3)$, $Bi_2O_3$—BaO, or $(La_2O_3)x(CeO_2)1-x$, an Ovonic Threshold Switching (OTS) device including a chalcogenide-based material such as $Ge_2Sb_2Te_5$, $As_2Te_3$, $As_2$, or $As_2Se_3$, or a tunneling insulating layer. The tunneling insulating layer may be formed of a thin film including an insulating material such as a silicon oxide, a silicon nitride, a metal oxide, or the like, and may allow tunneling of electrons when a certain voltage or current is applied thereto. The first and second selection element layers 130 and 230 may have a single-layered structure, or a multi-layered structure that embodies the selection element characteristic using a combination of more than two layers.

The first and second memory layers 150 and 250 may store different data in various manners. For example, the first and second memory layers 150 and 250 may include a variable resistance layer that switches between different resistance states according to an applied voltage or current. The variable resistance layer may include a material used in an RRAM, a PRAM, an FRAM, or an MRAM. For example, the material may include a metal oxide such as a transition metal oxide or a perovskite-based material, a phase-change material such as a chalcogenide-based material, a ferroelectric material, a ferromagnetic material, or the like. The variable resistance layer may have a single-layered structure, or a multi-layered structure that embodies a variable resistance characteristic using a combination of more than two layers.

For example, the variable resistance layer may include a metal oxide containing a large amount of oxygen vacancies. The metal oxide containing the large amount of oxygen vacancies may be a metal oxide containing less oxygen than a stoichiometric metal oxide. In this case, when a current path due to oxygen vacancies is generated in the metal oxide, the variable resistance layer may have a low resistance state and store data '1.' Conversely, when the current path due to oxygen vacancies disappears in the metal oxide, the variable resistance layer may have a high resistance state and store data '0.'

Each of the first and second lower electrode layers 120 and 220, the first and second middle electrode layers 140 and 240, and the first and second upper electrode layers 160 and 260 may have a single-layered structure or multi-layered structure including at least one of various conductive materials, such as a metal, a metal nitride, a carbon, and the like.

Particularly, in this implementation, an electrical resistance value and/or a thermal conductivity of the first middle electrode layer 140 located under the first memory layer 150 may be different from an electrical resistance value and/or a thermal conductivity of the first upper electrode layer 160 located over the first memory layer 150, and an electrical resistance value and/or a thermal conductivity of the second middle electrode layer 240 located under the second memory layer 250 may be different from an electrical resistance value and/or a thermal conductivity of the second upper electrode layer 260 located over the second memory layer 250. Furthermore, a magnitude relationship of the electrical resistance values and/or the thermal conductivities between the first middle electrode layer 140 and the first upper electrode layer 160 may be opposite to a magnitude relationship of the electrical resistance values and/or the thermal conductivities between the second middle electrode layer 240 and the second upper electrode layer 260. Here, as an electrical resistance value of a certain material increases, a thermal conductivity of the certain material may decrease.

Specifically, when the electrical resistance value of the first middle electrode layer 140 is smaller than the electrical resistance value of the first upper electrode layer 160 in the first memory cell MC11, the electrical resistance value of the second middle electrode layer 240 may be larger than the electrical resistance value of the second upper electrode layer 260 in the second memory cell MC21. Alternatively, when the electrical resistance value of the first middle electrode layer 140 is larger than the electrical resistance value of the first upper electrode layer 160 in the first memory cell MC11, the electrical resistance value of the second middle electrode layer 240 may be smaller than the electrical resistance value of the second upper electrode layer 260 in the second memory cell MC21.

Also, when the thermal conductivity of the first middle electrode layer 140 is larger than the thermal conductivity of the first upper electrode layer 160 in the first memory cell MC11, the thermal conductivity of the second middle electrode layer 240 may be smaller than the thermal conductivity of the second upper electrode layer 260 in the second memory cell MC21. Alternatively, when the thermal conductivity of the first middle electrode layer 140 is smaller than the thermal conductivity of the first upper electrode layer 160 in the first memory cell MC11, the thermal conductivity of the second middle electrode layer 240 may be larger than the thermal conductivity of the second upper electrode layer 260 in the second memory cell MC21.

As an example, when materials used for forming the first and second middle electrode layers 140 and 240 and the first and second upper electrode layers 160 and 260 are N doped carbon, carbon, high Al doped TiAlN, TiAlN, TiSiN, TaN, Ta, WN, TiN, Ti, W, Al, or Cu, an electrical resistance relationship and/or a thermal conductivity relationship of these materials may be as follows:

(1) electrical resistance relationship
N doped carbon>carbon>high Al doped TiAlN>TiAlN>TiSiN>TaN>Ta>WN>TiN>Ti>W>Al>Cu (2) thermal conductivity relationship
N doped carbon<carbon<high Al doped TiAlN<TiAlN<TiSiN<TaN<Ta<WN<TiN<Ti<W<Al<Cu Therefore, by considering the electrical resistance relationship and/or the thermal conductivity relationship of the above materials, specific materials used for forming the first and second middle electrode layers 140 and 240 and the first and second upper electrode layers 160 and 260 may be determined.

For example, the electrical resistance value of the first middle electrode layer 140 may be smaller than the electrical resistance value of the first upper electrode layer 160, and the electrical resistance value of the second middle electrode layer 240 may be larger than the electrical resistance value of the second upper electrode layer 260. Accordingly, TiN may be used for forming the first middle electrode layer 140 and the second upper electrode layer 260, TiAlN may be used for forming the first upper electrode layer 160 and the second middle electrode layer 240.

Alternatively, for example, the electrical resistance value of the first middle electrode layer 140 may be smaller than the electrical resistance value of the first upper electrode layer 160, and the electrical resistance value of the second middle electrode layer 240 may be larger than the electrical resistance value of the second upper electrode layer 260. Accordingly, TaN may be used for forming the first middle electrode layer 140 and the second upper electrode layer 260, and carbon may be used for forming the first upper electrode layer 160 and the second middle electrode layer 240.

In other implementations, various combinations of the above materials may be used to form the various electrode layers, in order to satisfy the desired electrical resistance relationship and/or thermal conductivity relationship between the electrode layers.

The first middle electrode layer 140 and the second upper electrode layer 260 may be formed of the same material as each other, and the first upper electrode layer 160 and the second middle electrode layer 240 may be formed of the same material as each other, but implementations are not limited thereto. In other implementations, the first middle electrode layer 140 and the second upper electrode layer 260 may be formed of different materials from each other, and/or the first upper electrode layer 160 and the second middle electrode layer 240 may be formed of different materials from each other, so long as the magnitude relationship between the electrical resistance values of the first middle electrode layer 140 and the first upper electrode layer 160 is opposite to the magnitude relationship between the electrical resistance values of the second middle electrode layer 240 and the second upper electrode layer 260, and/or the magnitude relationship between the thermal conductivities of the first middle electrode layer 140 and the first upper electrode layer 160 is opposite to the magnitude relationship between the thermal conductivities of the second middle electrode layer 240 and the second upper electrode layer 260.

The magnitude of the electrical resistance value and/or the thermal conductivity may be determined in consideration of polarities of voltages applied to the first and second memory cells MC11 and MC21 and/or directions of currents flowing through the first and second memory cells MC11 and MC21.

As an example, when a positive voltage is applied to the second line 200 and a negative voltage is applied to the first and third lines 110 and 210, a current flowing through the first memory cell MC11 may be generated in a direction from a top of the first memory cell MC11 to a bottom of the first memory cell MC11 with respect to the orientation of FIG. 3B, and a current flowing through the second memory cell MC21 may be generated in a direction from a bottom of the second memory cell MC21 to a top of the second memory cell MC21 with respect to the orientation of FIG. 3B. Accordingly, a thermoelectric effect may cause a maximum temperature point of the first memory cell MC11 to shift toward the first middle electrode layer 140, and a maximum temperature point of the second memory cell MC21 to shift toward the second upper electrode layer 260.

In an embodiment, the electrical resistance value of the first middle electrode layer 140 may be smaller than the electrical resistance value of the first upper electrode layer 160, and the electrical resistance value of the second middle electrode layer 240 may be larger than the electrical resistance value of the second upper electrode layer 260. Also, in this case, the thermal conductivity of the first middle electrode layer 140 may be larger than the thermal conductivity of the first upper electrode layer 160, and the thermal conductivity of the second middle electrode layer 240 may be smaller than the thermal conductivity of the second upper electrode layer 260.

This shifts a maximum temperature point of the first memory cell MC11 in a direction from the first middle electrode layer 140 toward the first upper electrode layer 160, and shifts a maximum temperature point of the second memory cell MC21 in a direction from the second upper electrode layer 260 toward the second middle electrode layer 240. Therefore, the maximum temperature point of the first memory cell MC11 may become similar to the maximum temperature point of the second memory cell MC21, and thus a difference between magnitudes of the currents flowing through the first memory cell MC11 and the second memory cell MC21 may be reduced, although the directions of the currents flowing through the first memory cell MC11 and the second memory cell MC21 are opposite to each other. As a result, a difference in operating characteristics of the first memory cell MC11 and the second memory cell MC21 may be reduced.

Alternatively, in another example, when a negative voltage is applied to the second line 200 and a positive voltage is applied to the first and third lines 110 and 210, a current flowing through the first memory cell MC11 may be generated in a direction from bottom to top with respect to the orientation of FIG. 3B, and a current flowing through the second memory cell MC21 may be generated in a direction from top to bottom with respect to the orientation of FIG. 3B. Accordingly, a thermoelectric effect may cause a maximum temperature point of the first memory cell MC11 to move toward the first upper electrode layer 160, and a maximum temperature point of the second memory cell MC21 to move toward the second middle electrode layer 240. In an embodiment, the electrical resistance value of the first middle electrode layer 140 may be larger than the electrical resistance value of the first upper electrode layer 160, and the electrical resistance value of the second middle electrode layer 240 may be smaller than the electrical resistance value of the second upper electrode layer 260. Also, in this case, the thermal conductivity of the first middle electrode layer 140 may be smaller than the thermal conductivity of the first upper electrode layer 160, and the thermal conductivity of the second middle electrode layer 240 may be larger than the thermal conductivity of the second upper electrode layer 260. This shifts the maximum temperature point of the first memory cell MC11 in a direction from the first upper electrode layer 160 toward the first middle electrode layer 140, and shifts the maximum temperature point of the second memory cell MC21 in a direction from the second middle electrode layer 240 toward the second upper electrode layer 260. Therefore, the maximum temperature point of the first memory cell MC11 may become similar to the maximum temperature point of the second memory cell MC21, and thus the difference between the magnitudes of the currents flowing through the first memory cell MC11 and the second memory cell MC21 may be reduced, although the directions of the currents flowing through the first memory cell MC11 and the second memory cell MC21 are opposite to each other. As a result, the difference in operating characteristics of the first memory cell MC11 and the second memory cell MC21 may be reduced.

Figure 4A:
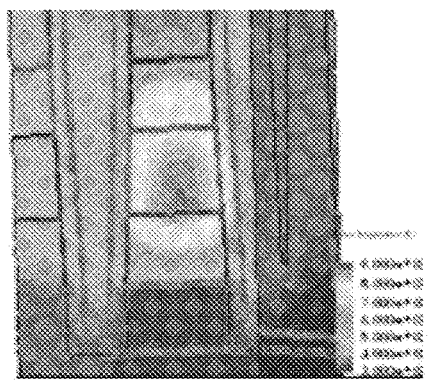
FIG. 4A is a view showing a maximum temperature point during an operation of the first memory cell in the semiconductor memory of FIGS. 1A and 1B.
Figure 4B:
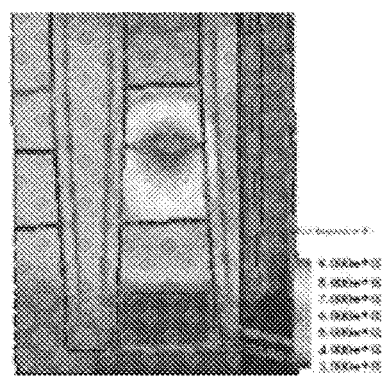
FIG. 4B is a view showing a maximum temperature point during an operation of a first memory cell in the semiconductor memory of FIGS. 3A and 3B.

When adjusting the magnitudes of the electrical resistance values and/or the thermal conductivities of the first and second middle electrode layers 140 and 240 and the first and second upper electrode layers 160 and 260, the movement of the maximum temperature point is experimentally confirmed as shown in FIGS. 4A and 4B, which will be described below.

FIG. 4A is a view showing a maximum temperature point during an operation of the first memory cell MC1 in the semiconductor memory of FIGS. 1A and 1B, and FIG. 4B is a view showing a maximum temperature point during an operation of the first memory cell MC11 in the semiconductor memory of FIGS. 3A and 3B.

Specifically, FIG. 4A shows the maximum temperature point of the first memory cell MC1 determined by a current flow in a direction from top to bottom with respect to the orientation of FIG. 2B when the two electrode layers 16 and 14 located over and under the memory layer 15 are formed of the same material, that is, when the two electrode layers 16 and 14 have the same electrical resistance value and/or the same thermal conductivity.

FIG. 4B shows the maximum temperature point of the first memory cell MC11 determined by a current flow in a direction from top to bottom with respect to the orientation of FIG. 3B when an electrical resistance value of the upper electrode layer 160 located over the memory layer 150 is larger than an electrical resistance value of the lower electrode layer 140 located under the memory layer 150 and a thermal conductivity of the upper electrode layer 160 is smaller than a thermal conductivity of the lower electrode layer 140.

Referring to FIGS. 4A and 4B, the maximum temperature point of the first memory cell MC 11 of FIG. 4B is shifted toward the upper electrode layer 160 in comparison with the maximum temperature point of the first memory cell MC1 of FIG. 4A.

Figure 5:
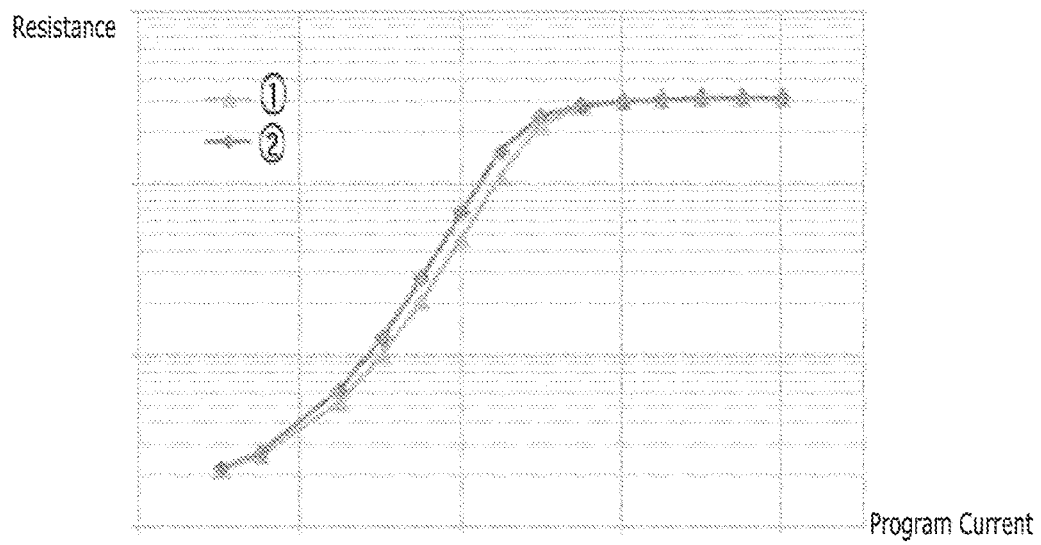
FIG. 5 is a graph illustrating current flows during operations of the first memory cell and a second memory cell in the semiconductor memory of FIGS. 3A and 3B.

Also, when adjusting the magnitudes of the electrical resistance values and/or the thermal conductivities of the first and second middle electrode layers 140 and 240 and the first and second upper electrode layers 160 and 260, a reduction in the difference between the currents flowing through the first memory cell MC11 and the second memory cell MC21 is experimentally confirmed as shown in FIG. 5, which will be described below.

FIG. 5 is a graph illustrating current flows during operations of the first memory cell MC11 and the second memory cell MC21 in the semiconductor memory of FIGS. 3A and 3B. Specifically, FIG. 5 shows the current flows of the first memory cell MC11 and the second memory cell MC21 when the electrical resistance value of the first middle electrode layer 140 is smaller than the electrical resistance value of the first upper electrode layer 160 and the electrical resistance value of the second middle electrode layer 240 is larger than the electrical resistance value of the second upper electrode layer 260, and/or when the thermal conductivity of the first middle electrode layer 140 is larger than the thermal conductivity of the first upper electrode layer 160 and the thermal conductivity of the second middle electrode layer 240 is smaller than the thermal conductivity of the second upper electrode layer 260.

Referring to FIG. 5, when a certain positive voltage is applied to the second line 200 and a certain negative voltage is applied to the first and third lines 110 and 210, there is almost no difference between a current flowing through the first memory cell MC11 (see ①) and a current flowing through the second memory cell MC21 (see ②).

As a result, the first memory cell MC11 and the second memory cell MC21 may have substantially the same operating characteristic.

Meanwhile, in the aforementioned implementation, a case in which the first and second memory layers 150 and 250 are located over the first and second selection element layers 130 and 230, respectively, has been described. However, as described above, positions of the first and second memory layers 150 and 250 and the first and second selection element layers 130 and 230 may be reversed with each other. In this case, an electrical resistance value and/or a thermal conductivity of each of the first and second lower electrode layers 120 and 220 located under the first and second memory layers 150 and 250, respectively, and the electrical resistance value and/or the thermal conductivity of each of the first and second middle electrode layers 140 and 240 located over the first and second memory layers 150 and 250, respectively, may be adjusted according to the aforementioned method. In other words, the electrical resistance value and/or the thermal conductivity of the first lower electrode layer 120 located under the first memory layer 150 may be different from the electrical resistance value and/or the thermal conductivity of the first middle electrode layer 140 located over the first memory layer 150, and the electrical resistance value and/or the thermal conductivity of the second lower electrode layer 240 located under the second memory layer 250 may be different from the electrical resistance value and/or the thermal conductivity of the second middle electrode layer 240 located over the second memory layer 250. However, a magnitude relationship of the electrical resistance values and/or the thermal conductivities between the first lower electrode layer 120 and the first middle electrode layer 140 may be opposite to a magnitude relationship of the electrical resistance values and/or the thermal conductivities between the second lower electrode layer 220 and the second middle electrode layer 240.

A fabricating method of the aforementioned semiconductor memory shown in FIGS. 3A and 3B will be briefly described below.

First, the first lines 110 may be formed by depositing a conductive material over the substrate 100 and selectively etching the conductive material. A space between the first lines 110 may be filled with an insulating material.

Then, the first memory cells MC11 may be formed by depositing material layers for forming the first lower electrode layer 120, the first selection element layer 130, the first middle electrode layer 140, the first memory layer 150, and the first upper electrode layer 160 over the first lines 110, and selectively etching the material layers. Here, the first memory cells MC11 may have a shape in which a width in the second direction parallel to the line A-A' increases as going from top to bottom with respect to the orientation of FIG. 3B due to characteristics of a dry etching. A space between the first memory cells MC11 may be filled with an insulating material.

Then, the second lines 200 may be formed by depositing a conductive material over the first memory cells MC11 and selectively etching the conductive material. A space between the second lines 200 may be filled with an insulating material.

Then, the second memory cells MC21 may be formed by depositing material layers for forming the second lower electrode layer 220, the second selection element layer 230, the second middle electrode layer 240, the second memory layer 250, and the second upper electrode layer 260 over the second lines 200, and selectively etching the material layers. Here, the second memory cells MC21 may have widths in the second direction that increase along a direction from a top of each of the second memory cells MC21 to a bottom of each of the memory cells MC21 with respect to the orientation of FIG. 3B, due to characteristics of a dry etching process used to form the second memory cells MC21. A space between the second memory cells MC21 may be filled with an insulating material.

Then, the third lines 210 may be formed by depositing a conductive material over the second memory cells MC21 and selectively etching the conductive material. A space between the third lines 210 may be filled with an insulating material.

Accordingly, the semiconductor memory shown in FIGS. 3A and 3B may be fabricated. However, the above fabricating processes may be variously modified. For example, the material layers for forming the first lower electrode layer 120, the first selection element layer 130, the first middle electrode layer 140, the first memory layer 150, and the first upper electrode layer 160 may be formed over the conductive material for forming the first lines 110 and etched into a line shape together with the conductive material for forming the first lines 110 during an etching process for forming the first lines 110. Then, the line-shaped material layers may be etched together with the conductive material for forming the second lines 200 during an etching process for forming the second lines 200. As a result, the first memory cell MC11 is formed to have an island shape in each of intersection regions of the first lines 110 and the second lines 200. In this case, the first memory cell MC11 having the island shape has four sidewalls, and the four sidewalls may include first two opposite sidewalls and second two opposite sidewalls. The first two opposite sidewalls may be aligned with sidewalls of the first lines 110 that extend in the first direction crossing the line A-A'. The second two opposite sidewalls may be aligned with sidewalls of the second lines 200 that extend in the second direction parallel to the line A-A'.

Similarly, the material layers for forming the second lower electrode layer 220, the second selection element layer 230, the second middle electrode layer 240, the second memory layer 250, and the second upper electrode layer 260 may be formed over the conductive material for forming the second lines 200 and etched together with the conductive material for forming the second lines 200 during an etching process for forming the second lines 200 to have a line shape. Then, the line-shaped material layers may be etched together with the conductive material for forming the third lines 210 during an etching process for forming the third lines 210. As a result, the second memory cell MC21 is formed to have an island shape in each of intersection regions of the second lines 200 and the third lines 210. In this case, the second memory cell MC21 has four sidewalls, and the four sidewalls may include first two opposite sidewalls and second two opposite sidewalls. The first two opposite sidewalls may be aligned with the sidewalls of the second lines 200 that extend in the second direction. The second two opposite sidewalls may be aligned with sidewalls of the third lines 210 that extend in the first direction.

The above and other memory circuits or semiconductor devices based on the disclosed technology can be used in a range of devices or systems. FIGS. 6-10 provide some examples of devices or systems that can implement the memory circuits disclosed herein.

Figure 6:
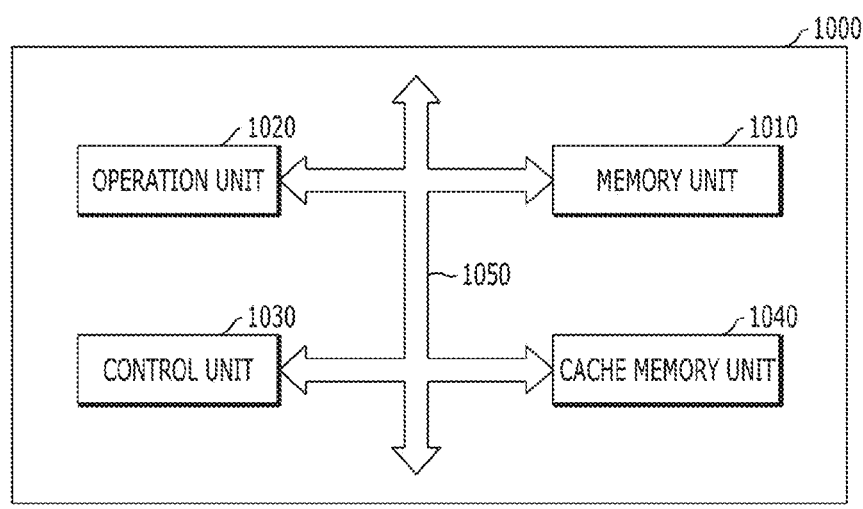
FIG. 6 is an example of a configuration diagram of a microprocessor implementing memory circuitry based on the disclosed technology.

FIG. 6 is an example of configuration diagram of a microprocessor implementing memory circuitry based on the disclosed technology.

Referring to FIG. 6, a microprocessor 1000 may perform tasks for controlling and tuning a series of processes of receiving data from various external devices, processing the data, and outputting processing results to external devices. The microprocessor 1000 may include a memory unit 1010, an operation unit 1020, a control unit 1030, and so on. The microprocessor 1000 may be various data processing units such as a central processing unit (CPU), a graphic processing unit (GPU), a digital signal processor (DSP) and an application processor (AP).

The memory unit 1010 is a part which stores data in the microprocessor 1000, as a processor register, register or the like. The memory unit 1010 may include a data register, an address register, a floating point register and so on. Besides, the memory unit 1010 may include various registers. The memory unit 1010 may perform the function of temporarily storing data for which operations are to be performed by the operation unit 1020, result data of performing the operations and addresses where data for performing of the operations are stored.

The memory unit 1010 may include one or more of the above-described semiconductor devices in accordance with the implementations. For example, the memory unit 1010 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the memory unit 1010 may be improved. As a consequence, operating characteristics of the microprocessor 1000 may be improved.

The operation unit 1020 may perform four arithmetical operations or logical operations according to results that the control unit 1030 decodes commands. The operation unit 1020 may include at least one arithmetic logic unit (ALU) and so on.

The control unit 1030 may receive signals from the memory unit 1010, the operation unit 1020 and an external device of the microprocessor 1000, perform extraction, decoding of commands, and controlling input and output of signals of the microprocessor 1000, and execute processing represented by programs.

The microprocessor 1000 according to the present implementation may additionally include a cache memory unit 1040 which can temporarily store data to be inputted from an external device other than the memory unit 1010 or to be outputted to an external device. In this case, the cache memory unit 1040 may exchange data with the memory unit 1010, the operation unit 1020 and the control unit 1030 through a bus interface 1050.

Figure 7:
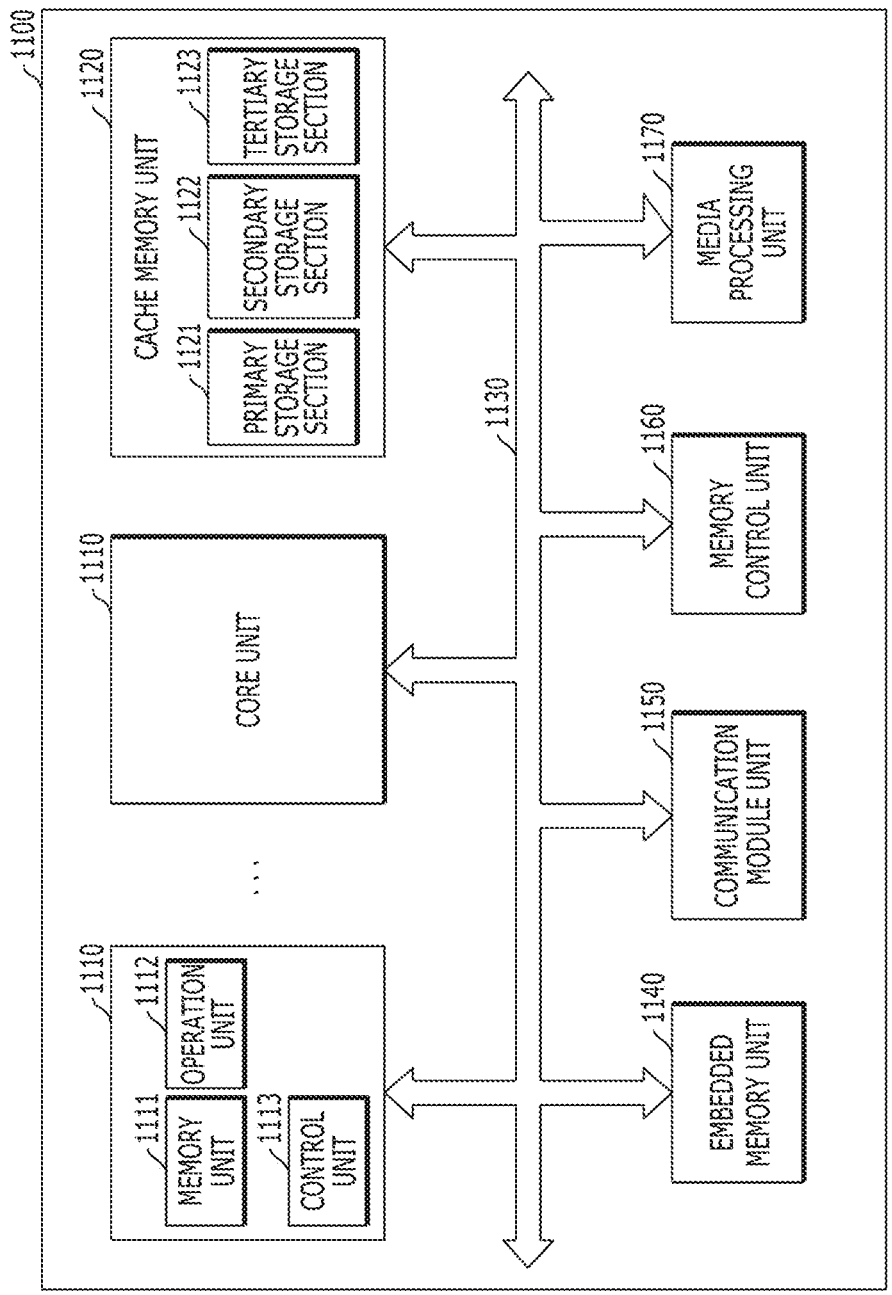
FIG. 7 is an example of a configuration diagram of a processor implementing memory circuitry based on the disclosed technology.

FIG. 7 is an example of configuration diagram of a processor implementing memory circuitry based on the disclosed technology.

Referring to FIG. 7, a processor 1100 may improve performance and realize multi-functionality by including various functions other than those of a microprocessor which performs tasks for controlling and tuning a series of processes of receiving data from various external devices, processing the data, and outputting processing results to external devices. The processor 1100 may include a core unit 1110 which serves as the microprocessor, a cache memory unit 1120 which serves to storing data temporarily, and a bus interface 1130 for transferring data between internal and external devices. The processor 1100 may include various system-on-chips (SoCs) such as a multi-core processor, a graphic processing unit (GPU) and an application processor (AP).

The core unit 1110 of the present implementation is a part which performs arithmetic logic operations for data inputted from an external device, and may include a memory unit 1111, an operation unit 1112 and a control unit 1113.

The memory unit 1111 is a part which stores data in the processor 1100, as a processor register, a register or the like. The memory unit 1111 may include a data register, an address register, a floating point register and so on. Besides, the memory unit 1111 may include various registers. The memory unit 1111 may perform the function of temporarily storing data for which operations are to be performed by the operation unit 1112, result data of performing the operations and addresses where data for performing of the operations are stored. The operation unit 1112 is a part which performs operations in the processor 1100. The operation unit 1112 may perform four arithmetical operations, logical operations, according to results that the control unit 1113 decodes commands, or the like. The operation unit 1112 may include at least one arithmetic logic unit (ALU) and so on. The control unit 1113 may receive signals from the memory unit 1111, the operation unit 1112 and an external device of the processor 1100, perform extraction, decoding of commands, controlling input and output of signals of processor 1100, and execute processing represented by programs.

The cache memory unit 1120 is a part which temporarily stores data to compensate for a difference in data processing speed between the core unit 1110 operating at a high speed and an external device operating at a low speed. The cache memory unit 1120 may include a primary storage section 1121, a secondary storage section 1122 and a tertiary storage section 1123. In general, the cache memory unit 1120 includes the primary and secondary storage sections 1121 and 1122, and may include the tertiary storage section 1123 in the case where high storage capacity is required. As the occasion demands, the cache memory unit 1120 may include an increased number of storage sections. That is to say, the number of storage sections which are included in the cache memory unit 1120 may be changed according to a design. The speeds at which the primary, secondary and tertiary storage sections 1121, 1122 and 1123 store and discriminate data may be the same or different. In the case where the speeds of the respective storage sections 1121, 1122 and 1123 are different, the speed of the primary storage section 1121 may be largest. At least one storage section of the primary storage section 1121, the secondary storage section 1122 and the tertiary storage section 1123 of the cache memory unit 1120 may include one or more of the above-described semiconductor devices in accordance with the implementations. For example, the cache memory unit 1120 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the cache memory unit 1120 may be improved. As a consequence, operating characteristics of the processor 1100 may be improved.

Although it was shown in FIG. 7 that all the primary, secondary and tertiary storage sections 1121, 1122 and 1123 are configured inside the cache memory unit 1120, it is to be noted that all the primary, secondary and tertiary storage sections 1121, 1122 and 1123 of the cache memory unit 1120 may be configured outside the core unit 1110 and may compensate for a difference in data processing speed between the core unit 1110 and the external device. Meanwhile, it is to be noted that the primary storage section 1121 of the cache memory unit 1120 may be disposed inside the core unit 1110 and the secondary storage section 1122 and the tertiary storage section 1123 may be configured outside the core unit 1110 to strengthen the function of compensating for a difference in data processing speed. In another implementation, the primary and secondary storage sections 1121, 1122 may be disposed inside the core units 1110 and tertiary storage sections 1123 may be disposed outside core units 1110.

The bus interface 1130 is a part which connects the core unit 1110, the cache memory unit 1120 and external device and allows data to be efficiently transmitted.

The processor 1100 according to the present implementation may include a plurality of core units 1110, and the plurality of core units 1110 may share the cache memory unit 1120. The plurality of core units 1110 and the cache memory unit 1120 may be directly connected or be connected through the bus interface 1130. The plurality of core units 1110 may be configured in the same way as the above-described configuration of the core unit 1110. In the case where the processor 1100 includes the plurality of core unit 1110, the primary storage section 1121 of the cache memory unit 1120 may be configured in each core unit 1110 in correspondence to the number of the plurality of core units 1110, and the secondary storage section 1122 and the tertiary storage section 1123 may be configured outside the plurality of core units 1110 in such a way as to be shared through the bus interface 1130. The processing speed of the primary storage section 1121 may be larger than the processing speeds of the secondary and tertiary storage section 1122 and 1123. In another implementation, the primary storage section 1121 and the secondary storage section 1122 may be configured in each core unit 1110 in correspondence to the number of the plurality of core units 1110, and the tertiary storage section 1123 may be configured outside the plurality of core units 1110 in such a way as to be shared through the bus interface 1130.

The processor 1100 according to the present implementation may further include an embedded memory unit 1140 which stores data, a communication module unit 1150 which can transmit and receive data to and from an external device in a wired or wireless manner, a memory control unit 1160 which drives an external memory device, and a media processing unit 1170 which processes the data processed in the processor 1100 or the data inputted from an external input device and outputs the processed data to an external interface device and so on. Besides, the processor 1100 may include a plurality of various modules and devices. In this case, the plurality of modules which are added may exchange data with the core units 1110 and the cache memory unit 1120 and with one another, through the bus interface 1130.

The embedded memory unit 1140 may include not only a volatile memory but also a nonvolatile memory. The volatile memory may include a DRAM (dynamic random access memory), a mobile DRAM, an SRAM (static random access memory), and a memory with similar functions to above mentioned memories, and so on. The nonvolatile memory may include a ROM (read only memory), a NOR flash memory, a NAND flash memory, a phase change random access memory (PRAM), a resistive random access memory (RRAM), a spin transfer torque random access memory (STTRAM), a magnetic random access memory (MRAM), a memory with similar functions.

The communication module unit 1150 may include a module capable of being connected with a wired network, a module capable of being connected with a wireless network and both of them. The wired network module may include a local area network (LAN), a universal serial bus (USB), an Ethernet, power line communication (PLC) such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB) such as various devices which send and receive data without transmit lines, and so on.

The memory control unit 1160 is to administrate and process data transmitted between the processor 1100 and an external storage device operating according to a different communication standard. The memory control unit 1160 may include various memory controllers, for example, devices which may control IDE (Integrated Device Electronics), SATA (Serial Advanced Technology Attachment), SCSI (Small Computer System Interface), RAID (Redundant Array of Independent Disks), an SSD (solid state disk), eSATA (External SATA), PCMCIA (Personal Computer Memory Card International Association), a USB (universal serial bus), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The media processing unit 1170 may process the data processed in the processor 1100 or the data inputted in the forms of image, voice and others from the external input device and output the data to the external interface device. The media processing unit 1170 may include a graphic processing unit (GPU), a digital signal processor (DSP), a high definition audio device (HD audio), a high definition multimedia interface (HDMI) controller, and so on.

Figure 8:
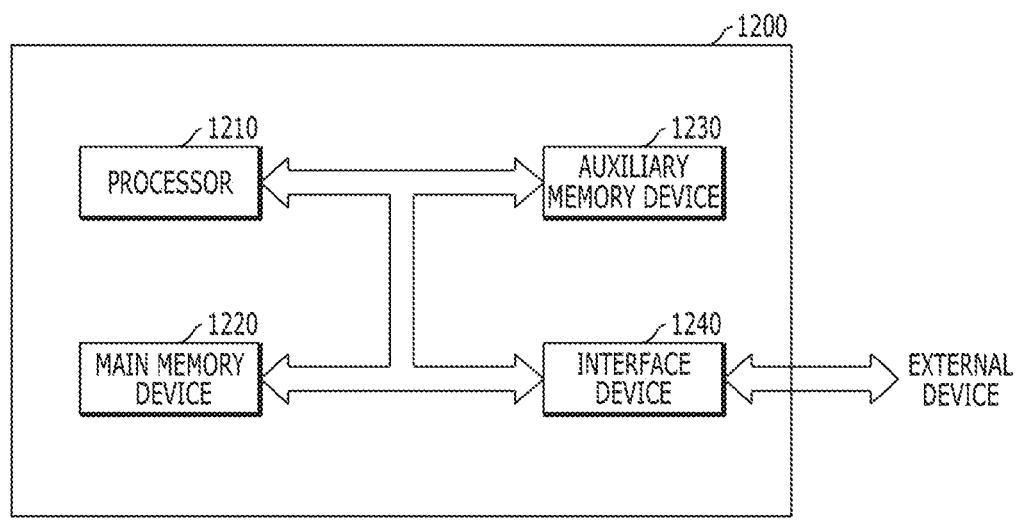
FIG. 8 is an example of a configuration diagram of a system implementing memory circuitry based on the disclosed technology.

FIG. 8 is an example of configuration diagram of a system implementing memory circuitry based on the disclosed technology.

Referring to FIG. 8, a system 1200 as an apparatus for processing data may perform input, processing, output, communication, storage, etc. to conduct a series of manipulations for data. The system 1200 may include a processor 1210, a main memory device 1220, an auxiliary memory device 1230, an interface device 1240, and so on. The system 1200 of the present implementation may be various electronic systems which operate using processors, such as a computer, a server, a PDA (personal digital assistant), a portable computer, a web tablet, a wireless phone, a mobile phone, a smart phone, a digital music player, a PMP (portable multimedia player), a camera, a global positioning system (GPS), a video camera, a voice recorder, a telematics, an audio visual (AV) system, a smart television, and so on.

The processor 1210 may decode inputted commands and processes operation, comparison, etc. for the data stored in the system 1200, and controls these operations. The processor 1210 may include a microprocessor unit (MPU), a central processing unit (CPU), a single/multi-core processor, a graphic processing unit (GPU), an application processor (AP), a digital signal processor (DSP), and so on.

The main memory device 1220 is a storage which can temporarily store, call and execute program codes or data from the auxiliary memory device 1230 when programs are executed and can conserve memorized contents even when power supply is cut off. The main memory device 1220 may include one or more of the above-described semiconductor devices in accordance with the implementations. For example, the main memory device 1220 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the main memory device 1220 may be improved. As a consequence, operating characteristics of the system 1200 may be improved.

Also, the main memory device 1220 may further include a static random access memory (SRAM), a dynamic random access memory (DRAM), and so on, of a volatile memory type in which all contents are erased when power supply is cut off. Unlike this, the main memory device 1220 may not include the semiconductor devices according to the implementations, but may include a static random access memory (SRAM), a dynamic random access memory (DRAM), and so on, of a volatile memory type in which all contents are erased when power supply is cut off.

The auxiliary memory device 1230 is a memory device for storing program codes or data. While the speed of the auxiliary memory device 1230 is slower than the main memory device 1220, the auxiliary memory device 1230 can store a larger amount of data. The auxiliary memory device 1230 may include one or more of the above-described semiconductor devices in accordance with the implementations. For example, the auxiliary memory device 1230 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the auxiliary memory device 1230 may be improved. As a consequence, operating characteristics of the system 1200 may be improved.

Also, the auxiliary memory device 1230 may further include a data storage system (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on. Unlike this, the auxiliary memory device 1230 may not include the semiconductor devices according to the implementations, but may include data storage systems (see the reference numeral 1300 of FIG. 9) such as a magnetic tape using magnetism, a magnetic disk, a laser disk using optics, a magneto-optical disc using both magnetism and optics, a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The interface device 1240 may be to perform exchange of commands and data between the system 1200 of the present implementation and an external device. The interface device 1240 may be a keypad, a keyboard, a mouse, a speaker, a mike, a display, various human interface devices (HIDs), a communication device, and so on. The communication device may include a module capable of being connected with a wired network, a module capable of being connected with a wireless network and both of them. The wired network module may include a local area network (LAN), a universal serial bus (USB), an Ethernet, power line communication (PLC), such as various devices which send and receive data through transmit lines, and so on. The wireless network module may include Infrared Data Association (IrDA), code division multiple access (CDMA), time division multiple access (TDMA), frequency division multiple access (FDMA), a wireless LAN, Zigbee, a ubiquitous sensor network (USN), Bluetooth, radio frequency identification (RFID), long term evolution (LTE), near field communication (NFC), a wireless broadband Internet (Wibro), high speed downlink packet access (HSDPA), wideband CDMA (WCDMA), ultra wideband (UWB), such as various devices which send and receive data without transmit lines, and so on.

Figure 9:
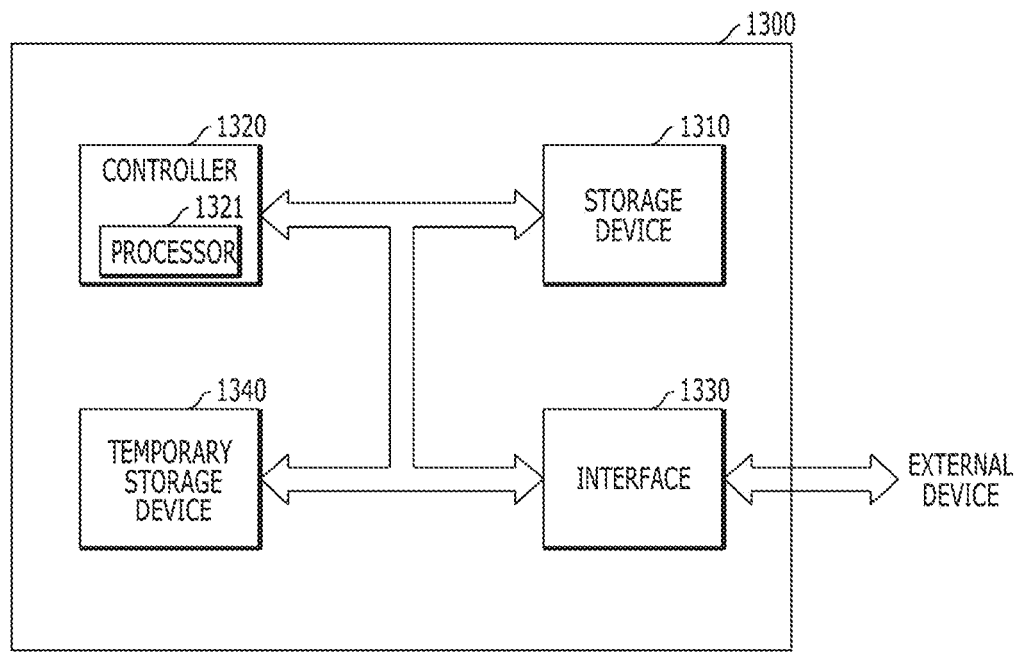
FIG. 9 is an example of a configuration diagram of a data storage system implementing memory circuitry based on the disclosed technology.

FIG. 9 is an example of configuration diagram of a data storage system implementing memory circuitry based on the disclosed technology.

Referring to FIG. 9, a data storage system 1300 may include a storage device 1310 which has a nonvolatile characteristic as a component for storing data, a controller 1320 which controls the storage device 1310, an interface 1330 for connection with an external device, and a temporary storage device 1340 for storing data temporarily. The data storage system 1300 may be a disk type such as a hard disk drive (HDD), a compact disc read only memory (CDROM), a digital versatile disc (DVD), a solid state disk (SSD), and so on, and a card type such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The storage device 1310 may include a nonvolatile memory which stores data semi-permanently. The nonvolatile memory may include a ROM (read only memory), a NOR flash memory, a NAND flash memory, a phase change random access memory (PRAM), a resistive random access memory (RRAM), a magnetic random access memory (MRAM), and so on.

The controller 1320 may control exchange of data between the storage device 1310 and the interface 1330. To this end, the controller 1320 may include a processor 1321 for performing an operation for, processing commands inputted through the interface 1330 from an outside of the data storage system 1300 and so on.

The interface 1330 is to perform exchange of commands and data between the data storage system 1300 and the external device. In the case where the data storage system 1300 is a card type, the interface 1330 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. In the case where the data storage system 1300 is a disk type, the interface 1330 may be compatible with interfaces, such as IDE (Integrated Device Electronics), SATA (Serial Advanced Technology Attachment), SCSI (Small Computer System Interface), eSATA (External SATA), PCMCIA (Personal Computer Memory Card International Association), a USB (universal serial bus), and so on, or be compatible with the interfaces which are similar to the above mentioned interfaces. The interface 1330 may be compatible with one or more interfaces having a different type from each other.

The temporary storage device 1340 can store data temporarily for efficiently transferring data between the interface 1330 and the storage device 1310 according to diversifications and high performance of an interface with an external device, a controller and a system. The temporary storage device 1340 for temporarily storing data may include one or more of the above-described semiconductor devices in accordance with the implementations. The temporary storage device 1340 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the temporary storage device 1340 may be improved. As a consequence, operating characteristics and data storage characteristics of the data storage system 1300 may be improved.

Figure 10:
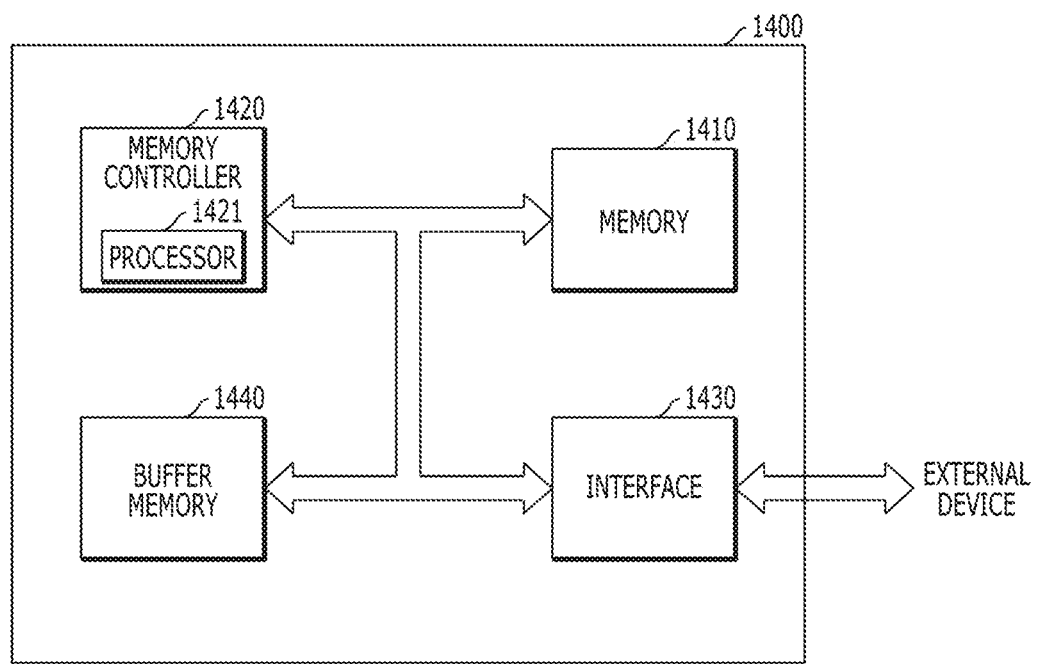
FIG. 10 is an example of a configuration diagram of a memory system implementing memory circuitry based on the disclosed technology.

FIG. 10 is an example of configuration diagram of a memory system implementing memory circuitry based on the disclosed technology.

Referring to FIG. 10, a memory system 1400 may include a memory 1410 which has a nonvolatile characteristic as a component for storing data, a memory controller 1420 which controls the memory 1410, an interface 1430 for connection with an external device, and so on. The memory system 1400 may be a card type such as a solid state disk (SSD), a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on.

The memory 1410 for storing data may include one or more of the above-described semiconductor devices in accordance with the implementations. For example, the memory 1410 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the memory 1410 may be improved. As a consequence, operating characteristics and data storage characteristics of the memory system 1400 may be improved.

Also, the memory 1410 according to the present implementation may further include a ROM (read only memory), a NOR flash memory, a NAND flash memory, a phase change random access memory (PRAM), a resistive random access memory (RRAM), a magnetic random access memory (MRAM), and so on, which have a nonvolatile characteristic.

The memory controller 1420 may control exchange of data between the memory 1410 and the interface 1430. To this end, the memory controller 1420 may include a processor 1421 for performing an operation for and processing commands inputted through the interface 1430 from an outside of the memory system 1400.

The interface 1430 is to perform exchange of commands and data between the memory system 1400 and the external device. The interface 1430 may be compatible with interfaces which are used in devices, such as a USB memory (universal serial bus memory), a secure digital (SD) card, a mini secure digital (mSD) card, a micro secure digital (micro SD) card, a secure digital high capacity (SDHC) card, a memory stick card, a smart media (SM) card, a multimedia card (MMC), an embedded MMC (eMMC), a compact flash (CF) card, and so on, or be compatible with interfaces which are used in devices similar to the above mentioned devices. The interface 1430 may be compatible with one or more interfaces having a different type from each other.

The memory system 1400 according to the present implementation may further include a buffer memory 1440 for efficiently transferring data between the interface 1430 and the memory 1410 according to diversification and high performance of an interface with an external device, a memory controller and a memory system. For example, the buffer memory 1440 for temporarily storing data may include one or more of the above-described semiconductor devices in accordance with the implementations. The buffer memory 1440 may include a first line extending in a first direction; a second line extending in a second direction crossing the first direction; a third line extending in a third direction crossing the second direction and being spaced apart from the first line in a fourth direction, the second line being disposed between the first line and the third line in the fourth direction, the fourth direction being perpendicular to the first to third directions; a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line, wherein, when an electrical resistance value of the first electrode is smaller than an electrical resistance value of the second electrode, an electrical resistance value of the third electrode is larger than an electrical resistance value of the fourth electrode, and wherein, when the electrical resistance value of the first electrode is larger than the electrical resistance value of the second electrode, the electrical resistance value of the third electrode is smaller than the electrical resistance value of the fourth electrode. Through this, operating characteristics of the buffer memory 1440 may be improved. As a consequence, operating characteristics and data storage characteristics of the memory system 1400 may be improved.

Moreover, the buffer memory 1440 according to the present implementation may further include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic. Unlike this, the buffer memory 1440 may not include the semiconductor devices according to the implementations, but may include an SRAM (static random access memory), a DRAM (dynamic random access memory), and so on, which have a volatile characteristic, and a phase change random access memory (PRAM), a resistive random access memory (RRAM), a spin transfer torque random access memory (STTRAM), a magnetic random access memory (MRAM), and so on, which have a nonvolatile characteristic.

Features in the above examples of electronic devices or systems in FIGS. 6-10 based on the memory devices disclosed in this document may be implemented in various devices, systems or applications. Some examples include mobile phones or other portable communication devices, tablet computers, notebook or laptop computers, game machines, smart TV sets, TV set top boxes, multimedia servers, digital cameras with or without wireless communication functions, wrist watches or other wearable devices with wireless communication capabilities.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described. Other implementations, enhancements and variations can be made based on what is described and illustrated in this patent document.

What is claimed is:

1. An electronic device comprising a semiconductor memory, the semiconductor memory comprises:
   a first line extending in a first direction;
   a second line extending in a second direction crossing the first direction;
   a third line extending in a third direction crossing the second direction and being spaced apart from the first line in a fourth direction, the second line being disposed between the first line and the third line in the fourth direction, the fourth direction being perpendicular to the first to third directions;
   a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and
   a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line,
   wherein, when an electrical resistance value of the first electrode is smaller than an electrical resistance value of the second electrode, an electrical resistance value of the third electrode is larger than an electrical resistance value of the fourth electrode, and
   wherein, when the electrical resistance value of the first electrode is larger than the electrical resistance value of the second electrode, the electrical resistance value of the third electrode is smaller than the electrical resistance value of the fourth electrode.

2. The electronic device according to claim 1, wherein the first electrode and the fourth electrode include the same first material, and the second electrode and the third electrode include the same second material.

3. The electronic device according to claim 1, wherein, when a voltage applied to the second line is relatively positive compared to voltages applied to the first and third lines, the first electrode includes a material having a smaller resistance value than a material of the second electrode, and the third electrode includes a material having a larger resistance value than a material of the fourth electrode.

4. The electronic device according to claim 3, wherein a maximum temperature point of the first memory element moves toward the second electrode compared to a case in which the first electrode and the second electrode include the same first material, and
wherein a maximum temperature point of the second memory element moves toward the third electrode compared to a case in which the third electrode and the fourth electrode include the same second material.

5. The electronic device according to claim 1, wherein, when a voltage applied to the second line is relatively negative compared to voltages applied to the first and third lines, the first electrode includes a material having a larger resistance value than a material of the second electrode, and the third electrode includes a material having a smaller resistance value than a material of the fourth electrode.

6. The electronic device according to claim 5, wherein a maximum temperature point of the first memory element moves toward the first electrode compared to a case in which the first electrode and the second electrode include the same first material, and
wherein a maximum temperature point of the second memory element moves toward the fourth electrode compared to a case in which the third electrode and the fourth electrode include the same second material.

7. The electronic device according to claim 1, wherein each of the first to fourth electrodes includes N doped carbon, carbon, high Al doped TiAlN, TiAlN, TiSiN, TaN, Ta, WN, TiN, Ti, W, Al, Cu, or a combination thereof.

8. The electronic device according to claim 1, wherein the first and second memory layers include a variable resistance material that switches between different resistance states according to an applied voltage or current.

9. The electronic device according to claim 1, wherein the semiconductor memory further comprises:
a first selection element layer interposed between the first line and the first electrode or between the second line and the second electrode; and
a second selection element layer interposed between the second line and the third electrode or between the third line and the fourth electrode.

10. An electronic device comprising a semiconductor memory, the semiconductor memory comprises:
a first line extending in a first direction;
a second line extending in a second direction crossing the first direction;
a third line extending in a third direction crossing the second direction and being spaced apart from the first line in a fourth direction, the second line being disposed between the first line and the third line in the fourth direction, the fourth direction being perpendicular to the first to third directions;
a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and
a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line,
wherein, when a thermal conductivity of the first electrode is larger than a thermal conductivity of the second electrode, a thermal conductivity of the third electrode is smaller than a thermal conductivity of the fourth electrode, and
wherein when the thermal conductivity of the first electrode is smaller than the thermal conductivity of the second electrode, the thermal conductivity of the third electrode is larger than the thermal conductivity of the fourth electrode.

11. The electronic device according to claim 10, wherein the first electrode and the fourth electrode include the same first material, and the second electrode and the third electrode include the same second material.

12. The electronic device according to claim 10, wherein, when a voltage applied to the second line is relatively positive compared to voltages applied to the first and third lines, the first electrode includes a material having a larger thermal conductivity than a material of the second electrode, and the third electrode includes a material having a smaller thermal conductivity than a material of the fourth electrode.

13. The electronic device according to claim 12, wherein a maximum temperature point of the first memory element moves toward the second electrode compared to a case in which the first electrode and the second electrode include the same first material, and
wherein a maximum temperature point of the second memory element moves toward the third electrode compared to a case in which the third electrode and the fourth electrode include the same second material.

14. The electronic device according to claim 10, wherein, when a voltage applied to the second line is relatively negative compared to voltages applied to the first and third lines, the first electrode includes a material having a smaller thermal conductivity than a material of the second electrode, and the third electrode includes a material having a larger thermal conductivity than a material of the fourth electrode.

15. The electronic device according to claim 14, wherein a maximum temperature point of the first memory element moves toward the first electrode compared to a case in which the first electrode and the second electrode include the same first material, and
wherein a maximum temperature point of the second memory element moves toward the fourth electrode compared to a case in which the third electrode and the fourth electrode include the same second material.

16. The electronic device according to claim 10, wherein each of the first to fourth electrodes includes N doped carbon, carbon, high Al doped TiAlN, TiAlN, TiSiN, TaN, Ta, WN, TiN, Ti, W, Al, Cu, or a combination thereof.

17. The electronic device according to claim 10, wherein the first and second memory layers include a variable resistance material that switches between different resistance states according to an applied voltage or current.

18. The electronic device according to claim 10, wherein the semiconductor memory further comprises:
- a first selection element layer interposed between the first line and the first electrode or between the second line and the second electrode; and
- a second selection element layer interposed between the second line and the third electrode or between the third line and the fourth electrode.

19. An electronic device comprising a semiconductor memory, the semiconductor memory comprises:
- a first line extending in a first direction;
- a second line extending in a second direction crossing the first direction;
- a third line extending in a third direction and being spaced apart from the first line in a fourth direction, the second line being disposed between the first line and the third line in the fourth direction, the fourth direction being perpendicular to the first to third directions;
- a first memory element disposed in a first intersection region, the first intersection region being between the first line and the second line in the fourth direction, the first memory element including a first memory layer disposed between the first line and the second line, a first electrode interposed between the first memory layer and the first line, and a second electrode interposed between the first memory layer and the second line; and
- a second memory element disposed in a second intersection region, the second intersection region being between the second line and the third line in the fourth direction, the second memory element including a second memory layer disposed between the second line and the third line, a third electrode interposed between the second memory layer and the second line, and a fourth electrode interposed between the second memory layer and the third line,
wherein a voltage having a first polarity is applied to the second line and voltages having a second polarity opposite to the first polarity are applied to the first and second lines, and
wherein the first electrode includes a material having a different electrical resistance value from a material of the second electrode and the third electrode includes a material having a different electrical resistance value from a material of the fourth electrode, a maximum temperature point of the first memory element being positioned similarly to a maximum temperature point of the second memory element when the voltages are applied to the first to third lines.

* * * * *